United States Patent
Przybysz et al.

(10) Patent No.: US 10,262,727 B2
(45) Date of Patent: Apr. 16, 2019

(54) GRADIOMETRIC FLUX QUBIT SYSTEM

(71) Applicants: Anthony Joseph Przybysz, Linthicum, MD (US); David George Ferguson, Takoma Park, MD (US)

(72) Inventors: Anthony Joseph Przybysz, Linthicum, MD (US); David George Ferguson, Takoma Park, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 0 days.

(21) Appl. No.: 15/645,736

(22) Filed: Jul. 10, 2017

(65) Prior Publication Data

US 2019/0013065 A1 Jan. 10, 2019

(51) Int. Cl.
| | | |
|---|---|---|
| G11C 11/44 | (2006.01) |
| G01R 19/00 | (2006.01) |
| G01R 1/28 | (2006.01) |
| G06N 10/00 | (2019.01) |

(52) U.S. Cl.
CPC ............. G11C 11/44 (2013.01); G01R 1/28 (2013.01); G01R 19/0084 (2013.01); G06N 10/00 (2019.01)

(58) Field of Classification Search
None
See application file for complete search history.

(56) References Cited

U.S. PATENT DOCUMENTS

| | | | |
|---|---|---|---|
| 6,320,369 B1 | 11/2001 | Hidaka et al. | |
| 2002/0180006 A1* | 12/2002 | Franz | B82Y 10/00 257/661 |
| 2004/0012407 A1* | 1/2004 | Amin | B82Y 10/00 326/3 |
| 2009/0167342 A1 | 7/2009 | Van Den Brink et al. | |

FOREIGN PATENT DOCUMENTS

| | | |
|---|---|---|
| JP | 2015035129 A | 2/2015 |
| WO | 2017083154 A1 | 5/2017 |

OTHER PUBLICATIONS

Kakuyanagi K et al: "Experimental analysis of the measurement strength dependence of superconducting qubit readout using a Josephson bifurcation readout method", Apr. 17, 2013, New Journal of Physics, Institute of Physics Publishing, Bristol, GB, vol. 15, No. 043028, abstract, figures 1, 2, section 2.*

(Continued)

*Primary Examiner* — Clayton E. LaBalle
*Assistant Examiner* — Jas A Sanghera
(74) *Attorney, Agent, or Firm* — Tarolli, Sundheim, Covell & Tummino LLP

(57) ABSTRACT

One example includes a flux qubit readout circuit. The circuit includes a gradiometric SQUID that is configured to inductively couple with a gradiometric flux qubit to modify flux associated with the gradiometric superconducting quantum interference device (SQUID) based on a flux state of the flux qubit. The circuit also includes a current source configured to provide a readout current through the gradiometric SQUID during a state readout operation to determine the flux state of the gradiometric flux qubit at a readout node.

20 Claims, 3 Drawing Sheets

(56) References Cited

OTHER PUBLICATIONS

Schwarz, et al.: "Gradiometric Flux Qubits with a Tunable Gap": New Journal of Physics 15 (2013) 045001 (21pp) Received Sep. 25, 2012; Published Apr. 4, 2013; Online at http://www.njp.org/; doi:10.1088/1367-2630/15/4/045001.

International Search Report corresponding to International Application No. PCT/US2018/040611 dated Dec. 4, 2018.

Deng, H. et al. "Working Point Adjustable DC-SQUID for the Readout of Gap Tunable Flux Qubit" IEEE Transactions on Applied Superconductivity, IEEE Service Center, Los Alamitos, CA, US, vol. 2. No. 3, Jun. 1, 2015 (Jun. 1, 2015), pp. 1-4, XP011574861, ISSN: 1051-8223, DOI: 10.1109/TASC.2015.2399272 [retrieved on Mar. 5, 2015] abstract; figures 1,3 Section II (Experimental).

Schwarz M J et al. "Paper; Gradiometric flux qubits with a tunable gap; Gradiometric flux qubits with a tunable gap",New Journal of Physics, Institute of Physics Publishing, Bristol, GB,vol. 15, No. 4, Apr. 4, 2013 (Apr. 4, 2013), p. 45001, XP020240001, ISSN: 1367-2630, DOI: 10.1088/1367-2630/15/4/045001. abstract; figures 4, 5. 4. Experimental results and discussion.

Harris R et al: "Experimental Demonstration of a Robust and Scalable Flux Qubit", arxiv.org, Cornell University Library, 201 Olin Library Cornell University Ithaca, NY 14853,Sep. 24, 2009 (Sep. 24, 2009), XP080368167, 001 : 10.1103/PHYSREVB.81.134510 abstract; figure 5 111. Device Architecture, Fabrication and Readout Operation.

Chiarello F et al: "of a Double SQUID Device for Quantum Computing Experiments",IEEE Transactions on Applied Superconductivity, IEEE Service Center,Los Alamitos, CA, US,vol. 17, No. 2, Jun. 1, 2007 (Jun. 1, 2007), pp. 124-127, XP011188133,ISSN: 1051-8223, DOI:10 . 1109/TASC.2007.897367 abstract; figure 1 section III. Qubit readout.

Fabio Chiarello et al: "Superconducting tunable flux qubit with direct readout scheme; Superconducting tunable flux qubit with direct readout scheme",Superconductor Science and Technology, IOP Publishing, Techno House, Bristol, GB,vol. 18, No. 10, Oct. 1, 2005 (Oct. 1, 2005), pp. 1370-1373, XP020087996, ISSN : 0953-204.8, DOI:10.1088/0953-2048/18/10/021 abstract; figure 2 Section 3. Integrated direct readout.

Shao-Xiong Li et al: "Efficiency of underdamped dc SQUIDS as readout devices for flux qubits", IEEE Transactions on Applied Superconductivity, IEEE Service Center, Los Alamitos, CA, US,vol. 13, No. 2, Jun. 1, 2003 (Jun. 1, 2003), pp. 982-985, XP011097942,ISSN: 1051-8223, DOI:10 .1109/TASC.2003.814119 abstract; figure 1 p. 982-p. 983.

Berggren K K et al: "Resonant Readout of a Persistent Current Qubit", IEEE Transactions on Applied Superconductivity, IEEE Service Center, Los Alamitos, CA, US,vol. 15, No. 2, Jun. 1, 2005 (Jun. 1, 2005), pp. 841-844, XP011133957,ISSN: 1051-8223, DOI: 10.1109/TASC.2005.850077 abstract; figures 1-5 Sections II and III.

Georg M Reuther et al: "Time-resolved qubit readout via nonlinear Josephson inductance", arxiv.org, Cornell University Library, 201 Olin Library Cornell University Ithaca, NY 14853, May 5, 2011 (May 5, 2011), XP080505689,DOI: 10.1088/1367-2630/13/9/093022 abstract Sections 3 and 4.

\* cited by examiner

GRADIOMETRIC FLUX QUBIT SYSTEM

This invention was made with Government support under Contract No. 30059298. The Government has certain rights in this invention.

TECHNICAL FIELD

This disclosure relates generally to quantum and classical circuit systems, and specifically to a gradiometric flux qubit system.

BACKGROUND

Superconducting qubits can take the form of an oscillator that can transfer energy between some combination of an electric field of a capacitor, a magnetic field of an inductor, and a superconducting phase difference, such as from a Josephson junction. One example of a qubit is a flux qubit (e.g., persistent current qubits). A flux qubit can be configured as a micrometer sized loop of superconducting metal interrupted by a number of Josephson junctions. The junction parameters can be designed during fabrication so that a persistent current can flow continuously when an external magnetic flux is applied. As only an integer number of flux quanta is allowed to penetrate the superconducting ring, a clockwise or a counter-clockwise current is developed in the loop to compensate a non-integer external flux bias. When the applied flux through the loop area is close to a half-integer number of flux quanta, the two lowest energy eigenstates of the loop can correspond to a quantum superposition of the clockwise and counter-clockwise currents.

SUMMARY

One example includes a flux qubit readout circuit. The circuit includes a gradiometric superconducting quantum interference device (SQUID) that is configured to inductively couple with a gradiometric flux qubit to modify flux associated with the gradiometric SQUID based on a flux state of the flux qubit. The circuit also includes a current source configured to provide a readout current through the gradiometric SQUID during a state readout operation to determine the flux state of the gradiometric flux qubit at a readout node.

Another example includes a method for reading a flux-state of a gradiometric flux qubit. The method includes providing a tuning voltage to a gradiometric superconducting quantum interference device (SQUID) to set a flux state of at least one readout flux loop associated with the gradiometric SQUID. The gradiometric SQUID can be inductively coupled with the gradiometric flux qubit. The method also includes providing a readout current through the gradiometric SQUID during a state readout operation. The method further includes detecting a voltage state at a readout node coupled to the gradiometric SQUID to determine the flux state of the gradiometric flux qubit based on the flux state of the at least one readout flux loop.

Another example includes a flux qubit system. The system includes a gradiometric flux qubit comprising a first qubit flux loop and a second qubit flux loop. The system also includes a flux qubit readout circuit. The flux qubit readout circuit includes a first readout flux loop inductively coupled to the first qubit flux loop. The flux qubit readout circuit also includes a second readout flux loop inductively coupled to the second qubit flux loop and being arranged in parallel with the first flux loop in a gradiometric flux configuration between a readout node and a voltage reference node. The flux qubit readout circuit further includes a current source configured to provide a readout current to the first and second readout flux loops during a state readout to determine a flux state of the gradiometric flux qubit. The flux state can be determined at the readout node.

DETAILED DESCRIPTION

This disclosure relates generally to quantum and classical circuit systems, and specifically to a gradiometric flux qubit system. The gradiometric flux qubit readout system can include a gradiometric flux qubit and a gradiometric flux readout circuit that includes a gradiometric SQUID. As described herein, the term "gradiometric" refers to a symmetric arrangement of flux loops in which the persistent current flows in opposite orientations to provide differential flux of opposing polarity (e.g., $\Delta$-flux, or $\Phi_\Delta$) through the respective flux loops of the gradiometric device (e.g., the gradiometric flux qubit and the gradiometric SQUID). Therefore, the flux states of the respective gradiometric devices are superpositions of persistent currents in the differential mode of the respective gradiometric device so that the respective energy levels of the gradiometric device are insensitive to changes in common mode flux (e.g., $\alpha$-flux, or $\Phi_\alpha$).

The gradiometric SQUID includes a first readout flux loop and a second readout flux loop that are inductively coupled, respectively, to a first qubit flux loop and a second qubit flux loop associated with the respective gradiometric flux qubit. As an example, the gradiometric SQUID and the gradiometric flux qubit can be fabricated in a planar arrangement on a substrate, and thus without any signal crossover associated with the respective persistent currents. For example, the gradiometric SQUID can also include at least one tuning input configured to receive a tuning voltage to set a flux state associated with the gradiometric SQUID, and thus opposing flux associated with each of the first and second readout flux loops. The gradiometric flux readout circuit can also include a current source configured to generate a readout current that is provided through the gradiometric SQUIDs. Based on the inductive coupling of the gradiometric SQUID to the gradiometric flux qubit, the flux state of the gradiometric SQUID can be modified, such that the readout current can be configured to trigger at least one Josephson junction associated with the gradiometric SQUID. For example, the readout current can be generated as a current ramp, such that the flux state can be determined based on an elapsed time during a state readout operation before a readout node associated with the gradiometric flux readout circuit is in a voltage state in response to the triggering of the Josephson junction(s).

Figure 1:
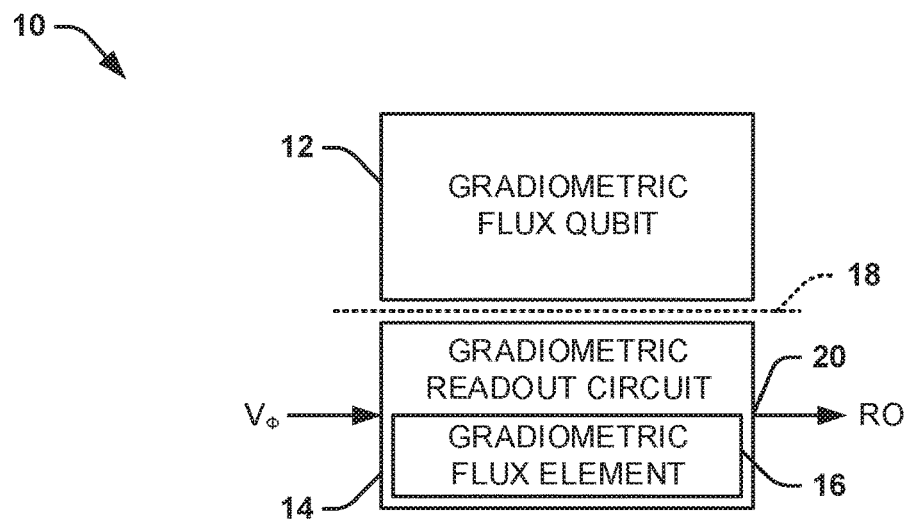
FIG. 1 illustrates an example of a gradiometric flux qubit system.

FIG. 1 illustrates an example diagram of a gradiometric flux qubit system 10. The gradiometric flux qubit system 10 can be implemented in any of a variety of quantum computing systems in which a gradiometric flux qubit 12 can store a quantum superposition of two states, and in which the flux state of the gradiometric flux qubit 12 is determined. The gradiometric flux qubit system 10 also includes a gradiometric readout circuit 14 that is configured to read the flux state of the gradiometric flux qubit 12. The gradiometric readout circuit 14 is demonstrated in the example of FIG. 1 as including a gradiometric superconducting quantum interference device (SQUID) 16. In the example of FIG. 1, the gradiometric flux qubit 12 and the gradiometric readout circuit 14 are inductively coupled, as demonstrated by a dotted line 18, such as with respect to the flux loops associated with each of the gradiometric flux qubit 12 and the gradiometric SQUID 16. As an example, the gradiometric flux qubit 12 and the gradiometric readout circuit 14 can be fabricated to be coplanar on a substrate (not shown).

The gradiometric readout circuit 14 can be configured to read the quantum flux state of the gradiometric flux qubit 12 based on an interaction of the flux of the gradiometric SQUID 16 and the gradiometric flux qubit 12 via the inductive coupling 18. For example, the flux associated with the flux loops of the gradiometric flux qubit 12 can modify the flux associated with the flux loops of the gradiometric SQUID 16, such that the persistent currents flowing about the respective flux loops of the gradiometric SQUID 16 can either increase or decrease to affect a triggering threshold of at least one Josephson junction associated with the gradiometric SQUID 16. In the example of FIG. 1, the gradiometric readout circuit 14 receives a tuning voltage $V_\Phi$ and a readout current $I_B$. As an example, the tuning voltage $V_\Phi$ can set a flux state of the gradiometric SQUID 16 that can interact with the flux state of the gradiometric flux qubit 12. Based on the flux state of the gradiometric SQUID 16, the flux state of the gradiometric flux qubit 12 can be determined during a state readout operation, such as based on a readout current, as described in greater detail herein. For example, in response to the readout current, the gradiometric readout circuit 14 can provide a readout voltage RO on a readout node 20. The readout voltage RO can be indicative of the flux state of the gradiometric flux qubit 12, such as based on an elapsed time of the state readout operation, as described in greater detail herein.

Figure 2:
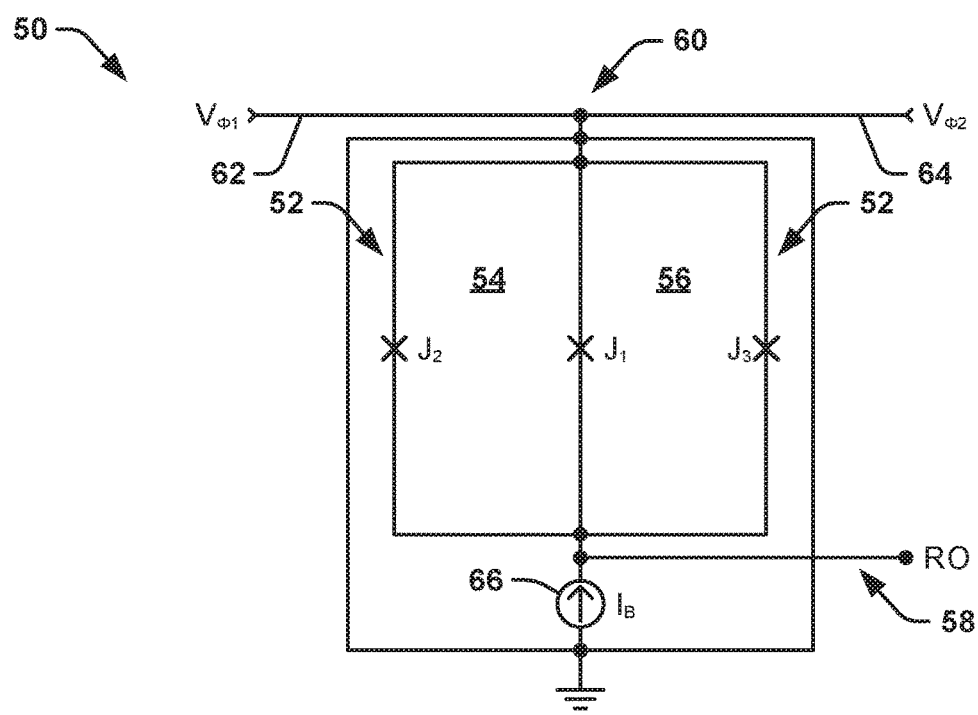
FIG. 2 illustrates an example of a gradiometric flux readout circuit.

FIG. 2 illustrates an example of a gradiometric flux readout circuit 50. The gradiometric readout circuit 50 can correspond to the gradiometric readout circuit 14 in the example of FIG. 1, and can thus be a part of the gradiometric flux qubit system 10. Therefore, reference is to be made to the example of FIG. 1 in the following description of the example of FIG. 2.

The gradiometric readout circuit 50 includes a gradiometric SQUID 52 that includes a first readout flux loop 54 and a second readout flux loop 56 that are arranged in parallel. The first readout flux loop 54 includes a first Josephson junction $J_1$ and a second Josephson junction $J_2$ arranged in parallel. Similarly, the second readout flux loop 56 includes the first Josephson junction $J_1$ and a third Josephson junction $J_3$ arranged in parallel, such that the first, second, and third Josephson junctions $J_1$, $J_2$, and $J_3$ are all arranged in parallel between a readout node 58 and a node 60 that is coupled to a low voltage rail (e.g., ground). The first and second readout flux loops 54 and 56 are configured to propagate currents in response to a flux state that corresponds to flux of opposite polarity being provided through the first and second readout flux loops 54 and 56, as described in greater detail herein.

The gradiometric readout circuit 50 also includes a first tuning input 62 and a second tuning input 64 that are coupled to the node 60. The first tuning input 62 is configured to receive a first tuning voltage $V_{\Phi 1}$ and the second tuning input 64 is configured to receive a second tuning voltage $V_{\Phi 2}$ to set a flux state of the gradiometric SQUID 52. In the example of FIG. 2, the first tuning input 62 extends along and proximal to a portion of the first readout flux loop 54, and the second tuning input 64 extends along and proximal to a portion of the second readout flux loop 56. As a result, the respective tuning voltages $V_{\Phi 1}$ and $V_{\Phi 2}$ can induce currents in the respective first and second readout flux loops 54 and 56, and thus can set the flux state of the gradiometric SQUID 52 based on the opposite-polarity flux through the respective first and second readout flux loops 54 and 56. As described in greater detail herein, the flux state of the associated gradiometric flux qubit (e.g., the gradiometric flux qubit 12 in the example of FIG. 1) can interact with the opposite-polarity flux of the first and second readout flux loops 54 and 56 to affect a threshold of the Josephson junctions $J_1$, $J_2$, and $J_3$. Additionally, in the example of FIG. 2, the tuning inputs 62 and 64 are demonstrated as being located at a distal portion of the gradiometric readout circuit 50 to facilitate a planar fabrication of the gradiometric readout circuit 50, and thus the gradiometric flux qubit system 10 (as demonstrated in greater detail herein).

The gradiometric readout circuit 50 further includes a current source 66 that is configured to generate a readout current $I_B$. As an example, the readout current $I_B$ can be generated as a current ramp, and thus having an amplitude that increases as a function of time. The current source 66 is arranged between the low voltage rail and the readout node 58, and can thus provide the readout current $I_B$ through the first and second readout flux loops 54 and 56, and thus through the Josephson junctions $J_1$, $J_2$, and $J_3$. In response, the Josephson junctions $J_1$, $J_2$, and $J_3$ are configured to trigger to set the readout node 58 to a voltage state, and thus to assert a readout signal RO. For example, based on the interaction of the flux associated with the gradiometric flux qubit 12 with respect to the opposite-polarity flux of the first and second readout flux loops 54 and 56, the currents propagating about the first and second readout flux loops 54 and 56 are either increased or decreased to likewise increase or decrease the thresholds of the Josephson junctions $J_1$, $J_2$, and $J_3$. As described herein, the "threshold" of the Josephson junctions $J_1$, $J_2$, and $J_3$ refers to the amplitude of the readout current $I_B$ that is required to trigger the Josephson junctions $J_1$, $J_2$, and $J_3$, either based on the sum of the currents in the first and second flux loops 54 and 56 flowing through the Josephson junction $J_1$ or the currents in the first and second flux loops 54 and 56 flowing through the Josephson junctions $J_2$ and $J_3$. Accordingly, the amplitude of the readout current $I_B$, and thus the time elapsed during the state readout operation, can determine the time at which the Josephson junctions $J_1$, $J_2$, and $J_3$ trigger to provide the voltage state, and thus the assertion of the readout signal RO at the readout node 58. As a result, the time of assertion of the readout signal RO can be determinative of the flux state of the associated gradiometric flux qubit.

Figure 3:
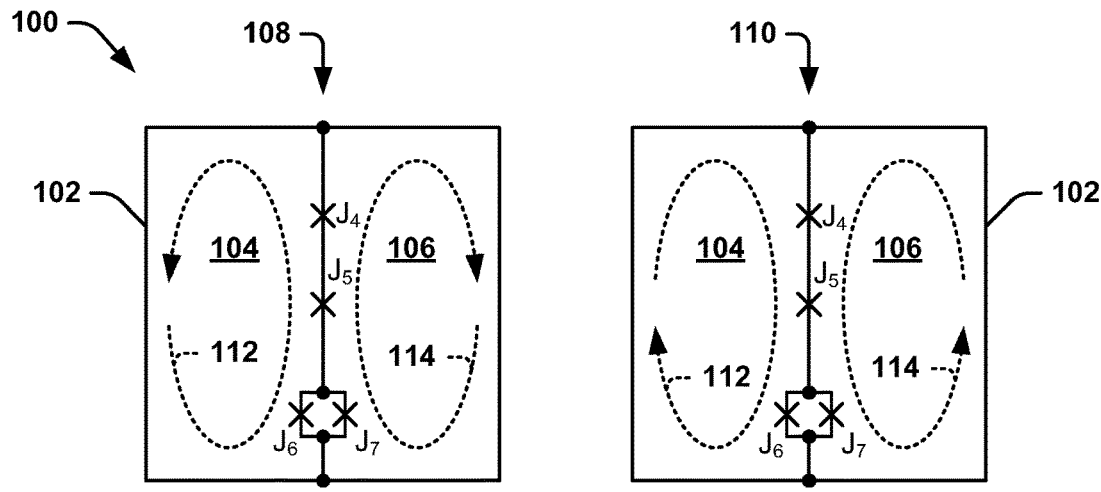
FIG. 3 illustrates an example diagram of a gradiometric flux qubit.

FIG. 3 illustrates an example diagram 100 of two flux states of a gradiometric flux qubit 102. The gradiometric flux qubit 102 demonstrated in the diagram 100 can correspond to the gradiometric flux qubit 12 in the example of FIG. 1. Therefore, reference is to be made to the example of FIG. 1 in the following description of the example of FIG. 3.

The gradiometric flux qubit 102 includes a first qubit flux loop 104 and a second qubit flux loop 106 that are arranged in parallel with each other, and which each include a first Josephson junction $J_4$ and a second Josephson junction $J_5$. The gradiometric flux qubit 102 also includes a parallel set of Josephson junctions $J_6$ and $J_7$, such that the Josephson junction $J_6$ is associated with the first qubit flux loop 104 and the Josephson junction $J_7$ is associated with the second qubit flux loop 106. In the example of FIG. 3, the diagram 100 demonstrates a first flux state of the gradiometric flux qubit 102, at 108, and a second flux state of the gradiometric flux qubit 102, at 110. In each of the flux states 108 and 110, the gradiometric flux qubit 102 is demonstrated as having opposite-polarity flux passing through the respective qubit flux loops 104 and 106. As a result of the opposite-polarity flux, the qubit flux loops 104 and 106 propagate persistent currents, demonstrated at 112 and 114, in opposite directions with respect to each other. Thus, in the first flux state 108, the first qubit flux loop 104 propagates a counter-clockwise current 112 and the second qubit flux loop 106 propagates a clockwise current 114. Similarly, in the second flux state 110, the first qubit flux loop 104 propagates a clockwise current 112 and the second qubit flux loop 106 propagates a counter-clockwise current 114.

Figure 4:
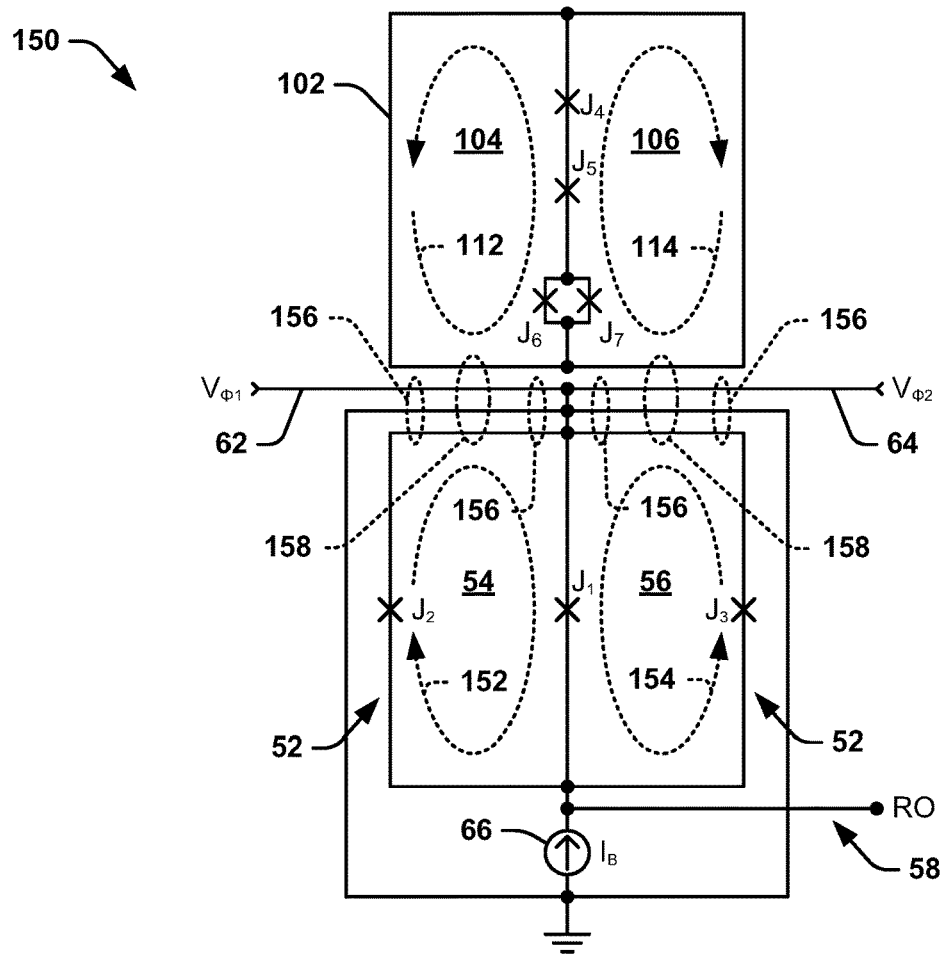
FIG. 4 illustrates an example of a gradiometric flux qubit system.

FIG. 4 illustrates an example of a gradiometric flux qubit system 150. The gradiometric flux qubit system 150 can correspond to the gradiometric flux qubit system 10 in the example of FIG. 1. Therefore, reference is to be made to the example of FIGS. 1-3 in the following description of the example of FIG. 4.

The gradiometric flux qubit system 150 demonstrates the gradiometric flux qubit 102 and the gradiometric readout circuit 50. The gradiometric flux qubit 102 is demonstrated as having the first flux state 108, with the first qubit flux loop 104 propagating a counter-clockwise current 112 and the second qubit flux loop 106 propagating a clockwise current 114. The gradiometric readout circuit 50 is demonstrated in proximity to the gradiometric flux qubit 102 to facilitate a readout of the flux state of the gradiometric flux qubit 102. For example, the gradiometric readout circuit 50 and the gradiometric flux qubit 102 can be fabricated in a planar arrangement on a substrate (not shown). The gradiometric readout circuit 50 is demonstrated as receiving the tuning voltages $V_{\Phi 1}$ and $V_{\Phi 2}$ at the respective tuning inputs 62 and 64 to provide differential flux, and thus counter-propagating currents, demonstrated at 152 and 154, about the respective readout flux loops 54 and 56.

For example, based on the application of the tuning voltages $V_{\Phi 1}$ and $V_{\Phi 2}$, a current can propagate along the tuning inputs 62 and 64 to induce the respective currents 152 and 154 in response to an inductive coupling of the tuning inputs 62 and 64 to a portion of the respective first and second readout flux loops 54 and 56, demonstrated at 156. While the currents 152 and 154 are demonstrated in the example of FIG. 4 as propagating clockwise and counter-clockwise, respectively, it is to be understood that the tuning voltages $V_{\Phi 1}$ and $V_{\Phi 2}$ can be provided at opposite polarity (e.g., negative) to provide the currents 152 and 154 in opposite polarity. Additionally, the gradiometric SQUID 52 can be further tuned by providing the tuning voltages $V_{\Phi 1}$ and $V_{\Phi 2}$ at opposite polarities with respect to each other to provide a same polarity common-mode flux (e.g., α-flux), through the entirety of the gradiometric SQUID 52. Thus, the gradiometric SQUID 52 can be tuned in a variety of different ways.

Based on the proximity of the gradiometric flux qubit 102 with the gradiometric SQUID 52 of the gradiometric readout circuit 50, the first qubit flux loop 104 is inductively coupled to the first readout flux loop 54 and the second qubit flux loop 106 is inductively coupled to the second readout flux loop 56, demonstrated in the example of FIG. 4 by respective inductive couplings 158. Based on the inductive couplings 158, the flux of the respective qubit flux loops 104 and 106 can modify the flux of the respective readout flux loops 54 and 56. As a result, the flux state of the gradiometric flux qubit 102 modifies the amplitude of the respective currents 152 and 154 propagating about the readout flux loops 54 and 56. In the example of FIG. 4, the currents 112 and 114 propagate in the opposite direction with respect to the currents 152 and 154. As a result, the amplitude of the currents 152 and 154 decrease to increase the threshold of the Josephson junctions $J_1$, $J_2$, and $J_3$ of the gradiometric SQUID 52. As an alternative example, if the gradiometric flux qubit 102 had the second flux state 110, then the currents 112 and 114 would propagate in the same direction with respect to the currents 152 and 154. As a result, in the alternative example, the amplitude of the currents 152 and 154 would increase to decrease the threshold of the Josephson junctions $J_1$, $J_2$, and $J_3$ of the gradiometric SQUID 52. The threshold of the Josephson junctions $J_1$, $J_2$, and $J_3$ thus corresponds to the amplitude of the readout current $I_B$ that is sufficient to trigger the Josephson junctions $J_1$, $J_2$, and $J_3$, and thus an amount of elapsed time of the state readout operation to trigger the Josephson junctions $J_1$, $J_2$, and $J_3$. Upon triggering of the Josephson junctions $J_1$, $J_2$, and $J_3$, the readout signal RO is asserted to indicate the flux state of the gradiometric flux qubit 102.

Figure 5:
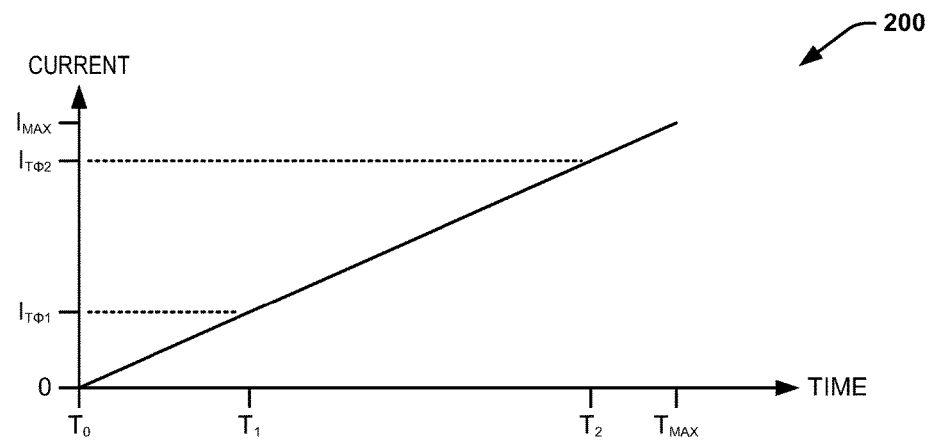
FIG. 5 illustrates an example of a graph.

FIG. 5 illustrates an example of a graph 200. The graph 200 demonstrates current amplitude as a function of time. The graph 200 demonstrates the current $I_B$ plotted as a current ramp from an amplitude of zero to an amplitude of $I_{MAX}$. In the example of FIG. 5, the readout current $I_B$ begins a state readout operation at zero amplitude at a time $T_0$, and is demonstrated as increasing linearly to the amplitude $I_{MAX}$ at a time $T_{MAX}$. Thus, the state readout operation can conclude at the time $T_{MAX}$, and can have a total duration of up to $T_{MAX}$.

In the example of FIG. 5, the current amplitude is demonstrated as having a first amplitude $I_{T\Phi 1}$ and a second amplitude $I_{T\Phi 2}$. The first amplitude $I_{T\Phi 1}$ can correspond to the threshold associated with the Josephson junctions $J_1$, $J_2$, and $J_3$ in the second flux state 110 of the gradiometric flux qubit 102, resulting from the currents 112 and 114 propagating in the same direction with respect to the currents 152 and 154. As a result, if the gradiometric flux qubit 102 is in the second flux state 110, the threshold of the Josephson junctions $J_1$, $J_2$, and $J_3$ is reduced based on the modification of the flux of the first and second readout flux loops 54 and 56 via the inductive coupling 158, resulting in an increase in the amplitude of the currents 152 and 154. Accordingly, if the gradiometric flux qubit 102 is in the second flux state 110, the Josephson junctions $J_1$, $J_2$, and $J_3$ begin to trigger at a time $T_1$, corresponding to a relatively shorter elapsed time from initiation of the state readout operation. Therefore, the readout signal RO being asserted (e.g., having a rising-edge) at approximately the time $T_1$ after initiation of the state readout operation can indicate that the gradiometric flux qubit 102 is in the second flux state 110.

As another example, the second amplitude $I_{T\Phi 2}$ can correspond to the threshold associated with the Josephson junctions $J_1$, $J_2$, and $J_3$ in the first flux state 108 of the gradiometric flux qubit 102, resulting from the currents 112 and 114 propagating in the opposite direction with respect to the currents 152 and 154. As a result, if the gradiometric flux qubit 102 is in the first flux state 108, the threshold of the Josephson junctions $J_1$, $J_2$, and $J_3$ is increased based on the modification of the flux of the first and second readout flux loops 54 and 56 via the inductive coupling 158, resulting in a decrease in the amplitude of the currents 152 and 154. Accordingly, if the gradiometric flux qubit 102 is in the first flux state 108, the Josephson junctions $J_1$, $J_2$, and $J_3$ begin to trigger at a time $T_2$, corresponding to a relatively longer elapsed time from initiation of the state readout operation. Therefore, the readout signal RO being asserted (e.g., having a rising-edge) at approximately the time $T_2$ after initiation of the state readout operation can indicate that the gradiometric flux qubit 102 is in the first flux state 108.

Therefore, the examples of FIGS. 1-5 demonstrate a gradiometric readout circuit for reading a flux state of a gradiometric flux qubit. Because the gradiometric readout circuit described herein has a gradiometric arrangement, the inductive coupling of the gradiometric SQUID of the gradiometric readout circuit can be more strongly inductively coupled to the gradiometric flux qubit than typical non-gradiometric readout circuits that are arranged in a planar fashion. Particularly, typical non-gradiometric readout circuit designs only include a single loop, and are thus more susceptible to external common-mode flux (e.g., α-flux), and can only be inductively coupled to a single one of the loops of the respective gradiometric flux qubit. However, because the gradiometric readout circuit described herein (e.g., the gradiometric readout circuit 50) is arranged as having a gradiometric SQUID, the gradiometric readout circuit herein is less susceptible to external flux with respect to the effects of the external flux on the flux currents (e.g., the currents 152 and 154), as the gradiometric SQUID 52 can be tuned by setting the tuning voltages $V_{\Phi 1}$ and $V_{\Phi 2}$ such that any external flux will not have any effect on the threshold of the Josephson junctions $J_1$, $J_2$, and $J_3$ while at the same time maintaining the sensitivity of the threshold of the Josephson junctions $J_1$, $J_2$, and $J_3$ to the flux state of the gradiometric flux qubit 102. Furthermore, the gradiometric SQUID 52 is easily and flexibly tuned by the tuning voltages $V_{\Phi 1}$ and $V_{\Phi 2}$, and can thus provide for better and more flexible operation than typical gradiometric readout circuits. Furthermore, because the gradiometric flux qubit system 150 can be fabricated on a single layer in a planar fashion on a substrate, the gradiometric flux qubit system 150 can be fabricated such that there are no wiring crossovers to substantially mitigate decoherence resulting from wiring dielectrics.

Figure 6:
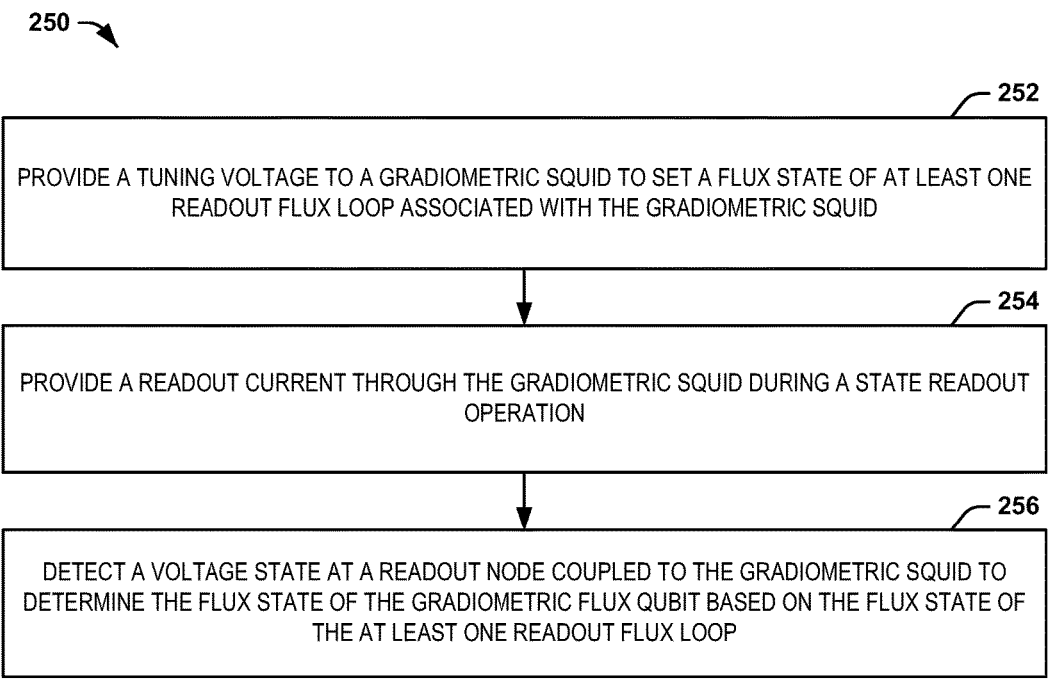
FIG. 6 illustrates an example of a method for reading a flux-state of a gradiometric flux qubit.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 6 illustrates an example of a method 250 for reading a flux-state of a gradiometric flux qubit (e.g., the gradiometric flux qubit 12). At 252, a tuning voltage (e.g., the tuning voltage $V_\Phi$) is provided to a gradiometric superconducting quantum interference device (SQUID) (e.g., the gradiometric SQUID 16) to set a flux state of at least one readout flux loop (e.g., the readout flux loops 54 and 56) associated with the gradiometric SQUID. The gradiometric SQUID can be inductively coupled with the gradiometric flux qubit. At 254, a readout current (e.g., the readout current $I_B$) is provided through the gradiometric SQUID during a state readout operation. At 256, a voltage state (e.g., the readout signal RO) is detected at a readout node (e.g., the readout node 58) coupled to the gradiometric SQUID to determine the flux state of the gradiometric flux qubit based on the flux state of the at least one readout flux loop.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A flux qubit readout circuit comprising:
    a gradiometric superconducting quantum interference device (SQUID) that is configured to inductively couple with a gradiometric flux qubit to modify flux associated with the gradiometric SQUID based on a flux state of the gradiometric flux qubit; and
    a current source configured to provide a readout current through the gradiometric SQUID during a state readout operation to determine the flux state of the gradiometric flux qubit at a readout node.

2. The circuit of claim 1, wherein the gradiometric SQUID comprises:
    a first readout flux loop comprising a first Josephson junction and a second Josephson junction; and
    a second readout flux loop comprising the first Josephson junction and a third Josephson junction, the second readout flux loop being arranged in parallel with the first readout flux loop between the readout node and a voltage reference node.

3. The circuit of claim 2, wherein the first readout flux loop and the second readout flux loop are arranged between the readout node and the voltage reference node, such that the first, second, and third Josephson junctions are configured to trigger in response to the readout current to provide a voltage state at the readout node.

4. The circuit of claim 2, further comprising:
    a first tuning input coupled to the first readout flux loop and being configured to set a flux state of the first readout flux loop in response to a first tuning voltage; and
    a second tuning input coupled to the second readout flux loop and being configured to set a flux state of the second readout flux loop in response to a second tuning voltage.

5. The circuit of claim 4, wherein the inductive coupling of the gradiometric flux qubit to the first and second readout flux loops modifies the flux state of each of the first and second readout flux loops, such that the readout current is configured to trigger the first, second, and third Josephson junctions based on the modified flux states.

6. The circuit of claim 2, wherein the current source is configured to generate the readout current as a current ramp, such that the flux state of the gradiometric flux qubit can be determined based on an elapsed time before at least one of the first, second, and third Josephson junctions is triggered in response to the readout current to provide a voltage state at the readout node during the state readout operation.

7. The circuit of claim 2, wherein the first readout flux loop is inductively coupled to a first qubit flux loop associated with the gradiometric flux qubit, and wherein the second readout flux loop is inductively coupled to a second qubit flux loop associated with the gradiometric flux qubit, such that the inductive coupling of the first readout flux loop and the first qubit flux loop modifies an amplitude of a first current in the first readout flux loop, and such that the inductive coupling of the second readout flux loop and the second qubit flux loop modifies an amplitude of a second current in the second readout flux loop, wherein the amplitude of the first and second currents affects a threshold amplitude of the first, second, and third Josephson junctions.

8. The circuit of claim 1, wherein the flux qubit readout circuit is fabricated in a substantially planar configuration on a substrate.

9. The circuit of claim 1, wherein the current source is configured to generate the readout current as a current ramp, such that the flux state of the gradiometric flux qubit can be determined based on an elapsed time before a voltage state is provided at the readout node during the state readout operation.

10. A flux qubit system comprising the flux qubit readout circuit of claim 1, the flux qubit system further comprising the gradiometric flux qubit.

11. A method for reading a flux-state of a gradiometric flux qubit, the method comprising:
providing a tuning voltage to a gradiometric superconducting quantum interference device (SQUID) to set a flux state of at least one readout flux loop associated with the gradiometric SQUID, the gradiometric SQUID being inductively coupled with the gradiometric flux qubit;
providing a readout current through the gradiometric SQUID during a state readout operation; and
detecting a voltage state at a readout node coupled to the gradiometric SQUID to determine the flux state of the gradiometric flux qubit based on the flux state of the at least one readout flux loop.

12. The method of claim 11, wherein the gradiometric SQUID comprises:
a first readout flux loop comprising a first Josephson junction and a second Josephson junction; and
a second readout flux loop comprising the first Josephson junction and a third Josephson junction, the second readout flux loop being arranged in parallel with the first readout flux loop between a readout node and the voltage reference node.

13. The method of claim 12, wherein providing the tuning voltage comprises:
providing a first tuning voltage to the first readout flux loop via a first tuning input to set a flux state of the first readout flux loop; and
providing a second tuning voltage to the second readout flux loop via a second tuning input to set a flux state of the second readout flux loop, wherein the flux state of each of the first and second readout flux loops is modified based on the inductive coupling of the gradiometric flux qubit to the first and second readout flux loops, such that the readout current is configured to trigger the first, second, and third Josephson junctions based on the modified flux states.

14. The method of claim 12, wherein the first readout flux loop is inductively coupled to a first qubit flux loop of the gradiometric flux qubit to modify the flux state of the first readout flux loop, and wherein the second readout flux loop is inductively coupled to a second qubit flux loop of the gradiometric flux qubit to modify the flux state of the second readout flux loop.

15. The method of claim 11, wherein providing the readout current comprises generating the readout current as a current ramp, and wherein detecting the voltage state at the readout node comprises monitoring an elapsed time before at least one Josephson junction associated with the gradiometric SQUID is triggered in response to the readout current to provide the voltage state at the readout node during the state readout operation.

16. A flux qubit system comprising:
a gradiometric flux qubit comprising a first qubit flux loop and a second qubit flux loop; and
a flux qubit readout circuit comprising:
a first readout flux loop inductively coupled to the first qubit flux loop;
a second readout flux loop inductively coupled to the second qubit flux loop and being arranged in parallel with the first flux loop in a gradiometric flux configuration between a readout node and a voltage reference node; and
a current source configured to provide a readout current to the first and second readout flux loops during a state readout to determine a flux state of the gradiometric flux qubit, the flux state being determined at the readout node.

17. The system of claim 16, wherein the first readout flux loop comprises a first Josephson junction and a second Josephson junction, wherein the second readout flux loop comprises the first Josephson junction and a third Josephson junction, wherein the inductive coupling of the first and second readout flux loops to the respective first and second qubit flux loops modifies a flux state of each of the first and second readout flux loops, such that the readout current is configured to trigger the first, second, and third Josephson junctions based on the modified flux state of each of the first and second readout flux loops.

18. The system of claim 16, wherein the flux qubit readout circuit further comprises:
a first tuning input coupled to the first readout flux loop and being configured to set a flux state of the first readout flux loop in response to a first tuning voltage; and
a second tuning input coupled to the second readout flux loop and being configured to set a flux state of the second readout flux loop in response to a second tuning voltage.

19. The system of claim 16, wherein the current source is configured to generate the readout current as a current ramp, such that the flux state of the gradiometric flux qubit can be determined based on an elapsed time before a voltage state is provided at the readout node during the state readout operation.

20. The system of claim 16, wherein the flux qubit readout circuit is fabricated in a substantially planar configuration on a substrate.

* * * * *